United States Patent [19]

Timin

[11] 4,113,082

[45] Sep. 12, 1978

[54] APPARATUS AND METHOD FOR STORING AND TRANSPORTING SUBSTRATES IN A BATCH-TYPE VACUUM PROCESS

[75] Inventor: Mitchell E. Timin, Berkeley, Calif.

[73] Assignee: Airco, Inc., Montvale, N.J.

[21] Appl. No.: 686,778

[22] Filed: May 17, 1976

[51] Int. Cl.² ............................................. B23Q 7/03
[52] U.S. Cl. .................... 198/339; 198/472; 198/580; 118/49; 204/298; 312/268; 185/39
[58] Field of Search ............ 198/472, 580, 648, 719, 198/720, 732, 339, 858, 859, 626, 604; 118/49, 49.1, 50, 50.1; 204/298; 427/248 G, 251; 312/266, 268; 185/37, 39; 104/128; 74/84 R, 112, 113, 122, 125

[56] References Cited

U.S. PATENT DOCUMENTS

| | | | |
|---|---|---|---|
| 1,837,605 | 12/1931 | Baker | 198/472 |
| 2,234,081 | 3/1941 | Nebuda | 198/859 |
| 3,321,092 | 5/1967 | Brichard | 118/49 |

FOREIGN PATENT DOCUMENTS 696,940  10/1940  Fed. Rep. of Germany ........... 198/580

Primary Examiner—Joseph E. Valenza
Attorney, Agent, or Firm—David A. Draegert; Edmund W. Bopp

[57] ABSTRACT

Apparatus and method are disclosed for supporting and transporting a multiplicity of workpieces during a process such as a batch-type vacuum coating process. The workpieces are placed in two stacks adjacent to process equipment inside a sealable chamber, and means are provided for moving substrates within each stack and between the stacks. Preferably, workpieces are successively conveyed from the top of one stack, through the process, to the top of the other stack, and simultaneously from the bottom of the second stack to the bottom of the first stack. The workpieces in the first stack are raised so that successive workpieces are presented at the top of the first stack. Similarly, the workpieces in the second stack are lowered to present successive workpieces at the bottom. Workpieces may be circulated through the stacks as many times as desired and may be processed one or more times during a single circuit.

5 Claims, 6 Drawing Figures

APPARATUS AND METHOD FOR STORING AND TRANSPORTING SUBSTRATES IN A BATCH-TYPE VACUUM PROCESS

FIELD OF THE INVENTION

The invention is in the field of systems for transporting workpieces inside sealed chambers such as are used in vacuum coating processes. The apparatus and method described herein are best suited for use in a batch-type process where it is desirable to process as many substrates as possible in each batch. This system further provides particular advantage in handling large sheet-like substrates.

DESCRIPTION OF THE PRIOR ART

It is known to place substrates in a magazine or stack under vacuum and remove them one at a time from the top, bottom, or middle for transport through a vacuum coating process. Thereafter, the substrates may be returned to the same magazine as disclosed in U.S. Pat. Nos. 3,516,386 and 3,822,200, or they may be forwarded to another, initially empty, magazine to be unloaded when the batch is fully processed as disclosed in U.S. Pat. Nos. 3,321,092 and 3,793,167.

A number of limitations are inherent in the prior art which are specifically overcome by the present invention. In prior art systems utilizing two magazines, one of which is empty at start-up, one half of the total capacity of the two magazines is not utilized at any point in the process. In the present systems it will be seen that the entire capacity of both of two magazines is utilized at all times, thus practically doubling the working capacity of a two magazine system. Additionally, in many of the prior art systems, separate incompatible coating steps were difficult or impossible to perform on the same substrates. The system disclosed herein, however, may be adapted either to a process with separate coatings applied in multiple in-line chambers separated by barriers or isolation valves, or to a process wherein separate coatings are applied in a single chamber during multiple passes of each substrate.

These and numerous other advantages of the present apparatus and method will become apparent to those skilled in the art.

SUMMARY OF THE INVENTION

The principal object of the method and apparatus of this invention is to increase the number of workpieces which can be processed in a sealed chamber in a given interval of time. The throughput is maximized by efficient construction and use of means to store, support and transport workpieces inside the sealed chamber before, during and after they are processed. The process may be a batch-type vacuum coating process or any other process which is conducted inside a sealed chamber.

According to the invention, a multiplicity of workpieces are placed in two magazines or stacks located adjacent to coating or other process equipment inside a sealable chamber. Means are provided for successively conveying workpieces from a last position in the first stack into a first position in the second stack. Means are also provided for conveying workpieces from a last position in the second stack into a first position in the first stack. Further, means are provided for moving the workpieces in each stack to remove a workpiece from the first position and to place a workpiece in the last position in the stack. The steps of moving substrates within a stack and conveying substrates between the stacks may be repeated as desired so that the workpieces circulate through all the positions in the stacks. The workpieces may be processed at any time during a circuit.

In a preferred embodiment, the workpieces or substrates are placed in two vertical stacks. In turn, each substrate is conveyed from the top of the first stack past the process equipment to the top of the second stack. The substrate at the top of the second stack is moved through each position in the stack until it reaches the bottom. From the bottom of the second stack, the substrate is conveyed to the bottom of the first stack and then moved through each position in the stack until it reaches the top. The substrates may be circulated in this manner and passed by the process equipment one or more times as desired.

Although the orderly circulation of substrates summarized above is preferable, it is within the scope of this invention to provide apparatus and method to convey substrates from any location of one stack to a vacancy at any location in the other stack. Further, more than two stacks may be employed as desired.

DETAILED DESCRIPTION OF A PREFERRED EMBODIMENT

The invention is an apparatus and method especially useful for maximizing the number of substrates which are processed in a single cycle of a batch-type vacuum coating process. However, it should be understood that the invention may have utility in processes other than coating or vacuum processes. The process may utilize a vacuum chamber 10 and process equipment 12 such as one or more evaporative sources, sputter sources, or the like. The process may have several shapes which may be separated by baffles 14 or other suitable structure. The process illustrated in FIG. 1 deposits a coating on one side of the workpieces 16; however, the process need not be limited to this arrangement.

Figure 1:
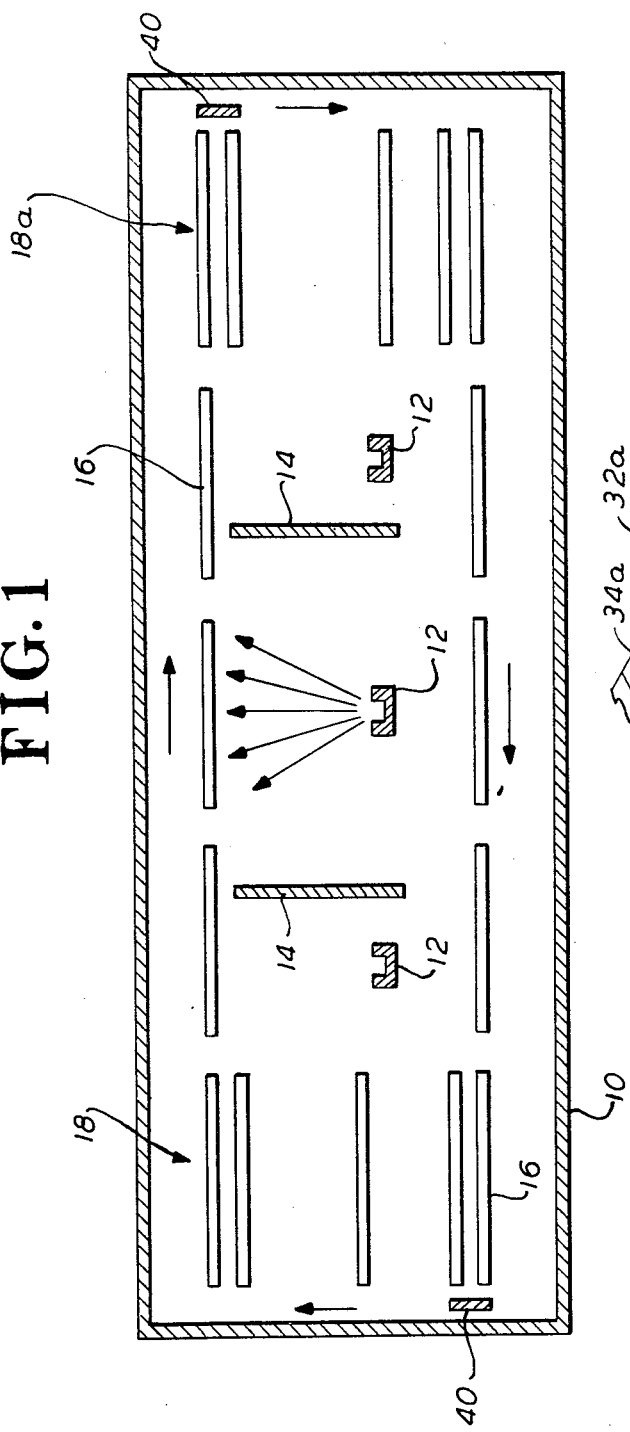
FIG. 1 is a schematic representation of the invention showing the manner in which workpieces are circulated, but not showing the specific means for conveying workpieces between stacks or moving them within each stack.

In broad terms the invention comprises a means for receiving and supporting a multiplicity of workpieces or substrates 16 arranged in at least two stack, preferably located at opposite ends of the process equipment. Means are provided for removing a substrate from a last position in the first stack 18 and conveying it to a first position in the second stack 18a. Means are also provided for removing a substrate from a last position in the second stack 18a and conveying it to a first position in the first stack 18. The stacks may be horizontal or vertical as desired. For convenience herein, the last position in the first stack and the first position in the second stack are each called the top, and the last postion in the second stack and the first postion in the first stack are each called the bottom. Thus, substrates 16 are conveyed from the top of the first stack to the top of the second stack and also from the bottom of the second to the bottom of the first. Means are provided for moving substrates toward the top in the first stack and toward the bottom in the second stack. In this manner a circulation of substrates 16 through each position in each stack is attained as illustrated in FIG. 1.

Figure 3:
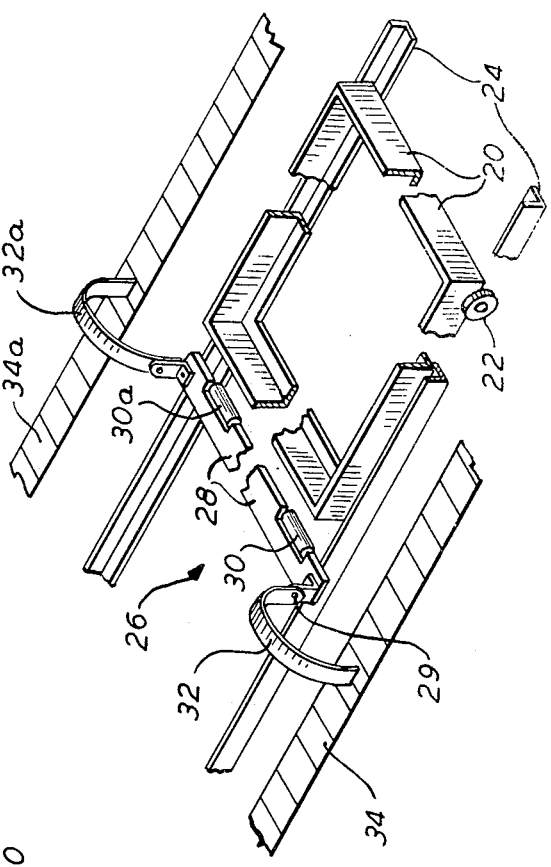
FIG. 3 is a detailed perspective view of a track, wheeled carrier, and pusher bar intended for use with the embodiment of FIG. 2.
Figure 2:
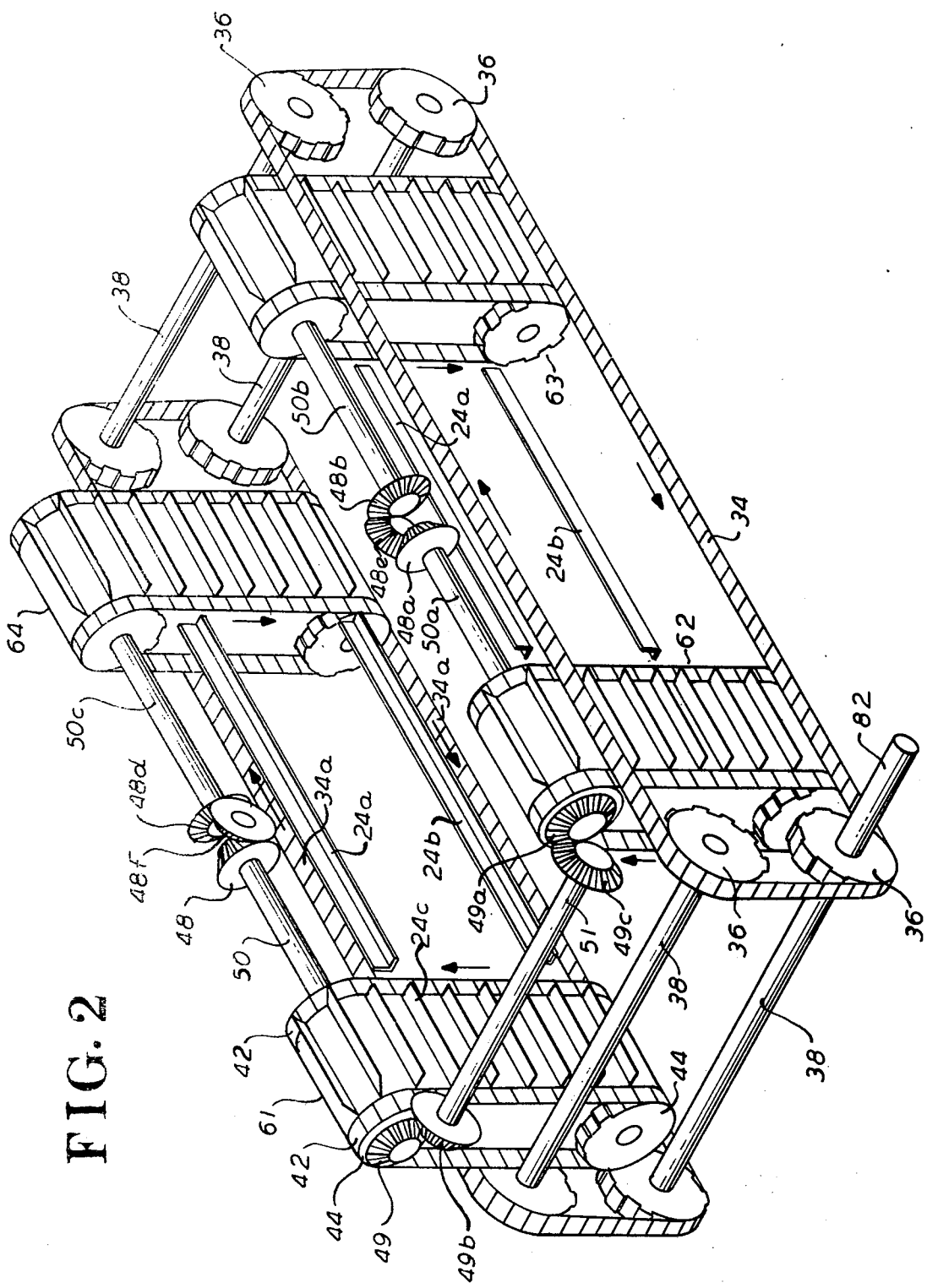
FIG. 2 is a perspective view of a preferred means to transport workpieces through the circulation path shown in FIG. 1.

FIGS. 2 and 3 illustrate a preferred structure for supporting and transporting substrates according to this invention. Carriers 20, which may have wheels 22, are provided to accommodate one or more substrates. Sections of tracks 24, which may be lengths of angle iron or the like, are provided for guiding and supporting opposite sides of a carrier. An upper set of tracks 24a is positioned for supporting the substrate carriers during conveyance from the top of the first stack to the top of the second stack. Likewise a lower set of tracks 24b may be positioned to support the substrate carriers during conveyance between the bottoms of the two stacks. Tracks 24a and 24b may be supported by any convenient framework although the same is not specifically shown in the drawings.

The substrates in the carriers 20 may be transported along tracks 24 by means of a number of pushers 26 as illustrated in FIG. 3. Pusher 26 preferably includes a horizontal pusher bar 28 and one or more rollers 30 and 30a protruding slightly from the leading edge and from the bottom of the pusher bar 28. Since the roller 30 extends slightly past the leading edge of pusher bar 28, it will butt against carrier 20 to advance it along track 24. Pusher bar 28 is suspended above tracks 24 by two resilient arch-like supports 32 and 32a attached to each end of pusher bar 28. The pusher bar 28 and the arch-like support may be connected by a spring-biased pivot 29 or other desired construction which allows the pusher bar 28 to ride up and over the carrier 20 when the carrier's motion is restrained. As this occurs, the rollers 30 and 30a protruding from the pusher bar 28 will roll over the top of the sides of carrier 20.

The flexible supports 32 and 32a are attached to and supported by two opposed conveyor belts 34 and 34a. As shown in FIG. 2, belt 34 is engaged around four pulleys or sprockets 36 mounted on four conveyor shafts 38. Belt 34a is similarly engaged around four other conveyor sprockets mounted on the four shafts 38. As the shafts 38 rotate, the belts 34 and 34a move together and the pushers 26 travel in a path roughly defining a rectangle when viewed from the side. Thus, a carrier is conveyed along tracks 24a from the top of the first stack to the top of the second stack where the carrier is restrained by a stop 40, as shown in FIG. 1. Similarly, another carrier is conveyed along the tracks 24b from the bottom of the second stack to the bottom of the first stack where there is another stop 40.

Elevator units for raising or lowering the substrates in each stack are also illustrated in FIG. 2. Each end of a multiplicity of sections of track 24c is attached to and supported by an elevator belt 42 which may be similar to conveyor belt 34. Each of the two or more elevator belts 42 is guided around a pair of pulleys or sprockets 44 disposed so that the belt travels primarily in a vertical plane. Preferably, one of each pair of elevator sprockets 44 is mounted on horizontal shaft 50 so that both the elevator belts 42 move in unison.

Four elevator units are provided with two opposed at each end of the means for conveying substrates between the stacks. The elevator units are preferably driven simultaneously by a series of shafts and gears. A bevel gear 49 is mounted on a shaft connected to the first elevator 61. Preferably the bevel gear 49 is mounted on the end of the shaft 50 which is furthest from the process. Gear 49 engages another bevel gear 49b mounted on one end of intermediate shaft 51 which makes a right angle with shaft 50. Similarly, a bevel gear 49c is mounted on the other end of shaft 51 and engages a bevel gear 49a preferably mounted on the end of a shaft 50a of the second elevator 62. The shaft 50a is parallel to the corresponding shaft 50 of the first elevator. It should be apparent that the bevel gears 49, 49a, 49b, and 49c will cause the shafts 50 and 50 to rotate in opposite directions and thereby cause the first and second elevators to operate together to raise or lower a substrate carrier supported between them. A shaft of the second elevator unit, preferably the same shaft 50a, is provided with a bevel gear 48a at the shaft end nearest to the process. A similarly located bevel gear 48b is attached to a shaft 50b of the third elevator unit 63. Preferably, shaft 50b is aligned on the same axis as 50a, and gears 48a and 48b both engage a bevel gear 48e mounted on a shaft (not shown) which makes right angles with shafts 50a and 50b. Thus, shafts 50a and 50b will rotate in opposite directions. In a similar manner, corresponding shafts 50 and 50c of the first and fourth elevators 61 and 64 respectively, will rotate in opposite directions as a result of the engagement of the bevel gears 48, 48d, and 48f which correspond to gears 48a, 48b, and 48e respectively. Thus, the four elevators are positioned and interconnected by shafts and gears in such a manner that the first and second elevators cooperate to raise a carrier at the same time that the third and fourth elevators cooperate to lower a carrier and vice versa.

Figure 4:
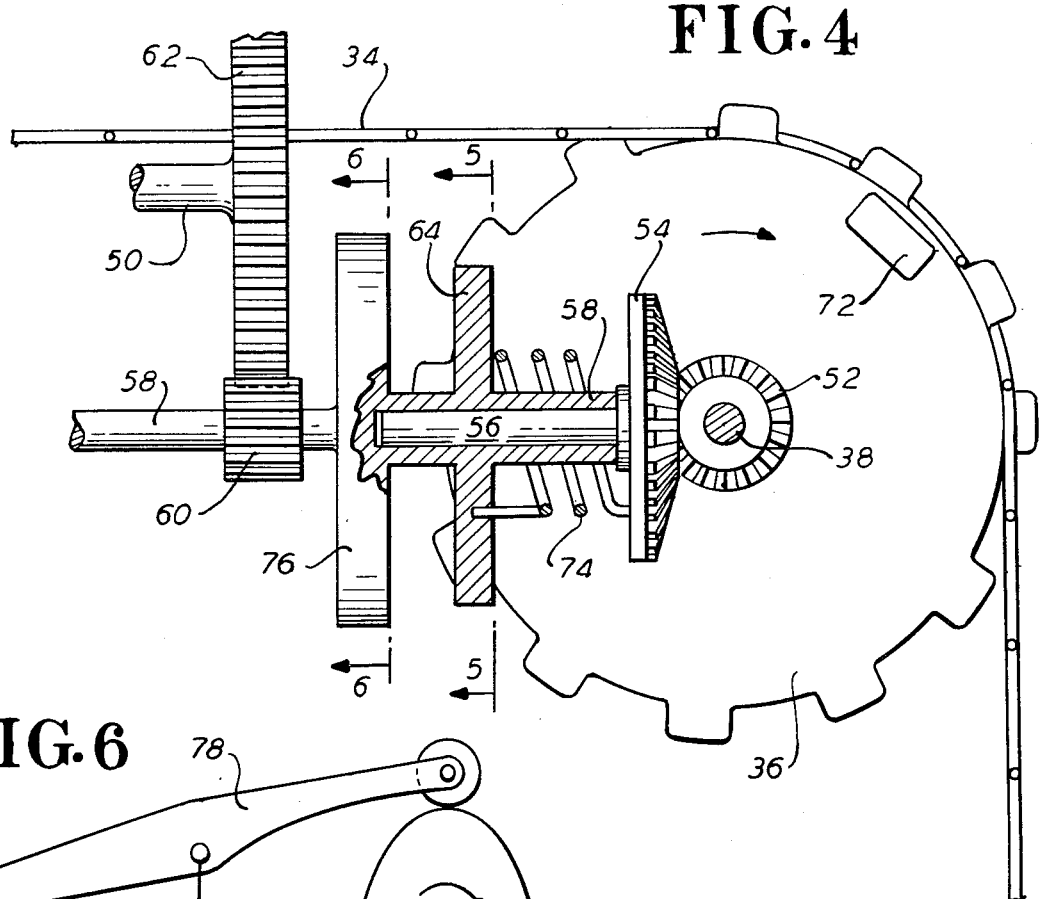
FIG. 4 is a detailed view of timing and driving means associated with the conveyor and elevators in the embodiment of FIG. 2.
Figure 5:
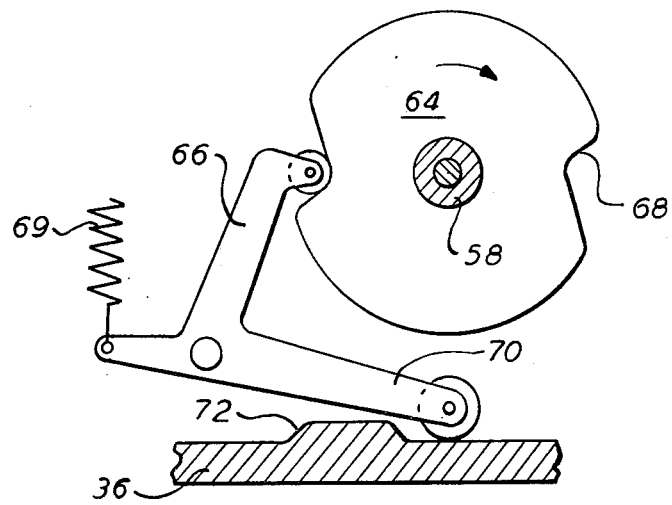
FIG. 5 is a sectional view taken along the line 5—5 in FIG. 4.

Each pair of elevators and the conveyor may be operated independently but preferably means, shown in detail in FIGS. 4 and 5, are provided for driving the elevator units in timed relation to the conveyor. A conveyor shaft 38 and an elevator shaft 50 are connected by intermittent drive means so that continuous rotation of the conveyor shaft will cause the elevator shaft to rotate intermittently. A bevel gear 52 is mounted on conveyor shaft 38 and engaged by bevel gear 54 mounted on journal shaft 56 at a right angle to shaft 38. Journal shaft 56 is rotatably mounted in countershaft 58 which is attached to first pinion 60. Pinion 60 engages a second pinion 62 which is attached to an extension of an elevator sprocket shaft 50.

Journal shaft 56 would turn freely in countershaft 58 except for the following driving and timing mechanism. A detent cam 64 is affixed to countershaft 58 and engaged by a suitable detent cam follower 66, shown in FIG. 5. Typically, detent cam follower 66 is urged by a spring 69 into engagement with detent cam 64 so that the detent cam 64 will be prevented from rotating when the detent cam follower 66 is forced into a detent recess 68 on detent cam 64. Means to retract the detent cam follower 66 from a detent recess 68 may comprise an arm 70 connected to the cam follower 66 which is actuated by a timing bump 72 on conveyor sprocket 36. Thus, when the bump 72 passes under the arm 70, the cam follower 66 will be lifted against the bias of spring 69 and out of detent recess 68, to allow the detent cam and countershaft 58 to turn freely. A torsion spring 74, or the like, is mounted with its axis concentric to countershaft 58 and connected between the second bevel gear 54 and the detent cam 64. Thus, if the detent cam 64 is restrained by the detent cam follower 66, energy will be stored in the torsion spring 74 as the conveyor sprocket 36 and associated gears 52 and 54 are turned. When the sprocket is turned to a point where the timing bump 72 causes the detent cam 64 to be released, the stored energy will be transmitted into the countershaft 58 and through the pinions 60 and 62 to the elevator shaft 50a until the next detent position is reached.

Figure 6:
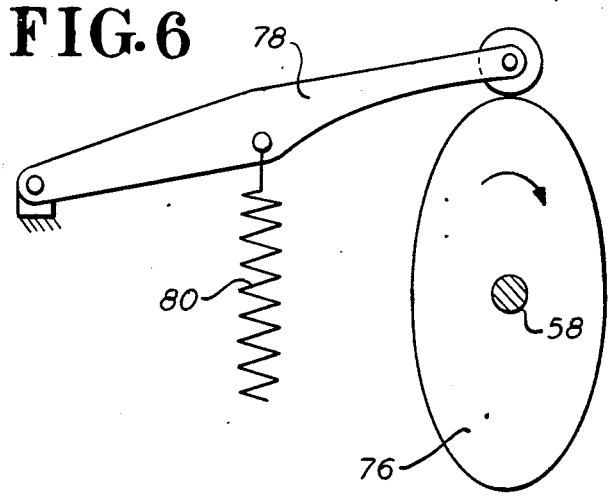
FIG. 6 is a sectional view taken along the line 6—6 in FIG. 4.

Preferably, an oval energy storage cam 76 is mounted also on countershaft 58 and engaged by an energy storage cam follower 78 which is biased by a spring 80. This latter subassembly is advantageous to overcome the inertia in the elevator units both during starting and stopping periods. As shown in FIG. 6, the energy storage cam is positioned at a point at which the elevator units would be stationary but ready to begin an indexing movement. When the detent cam 64 is released and both cams 64 and 76 begin to rotate, the energy storage cam follower 78 will tend to push the energy storage cam in the direction of rotation, thus adding energy to the system and aiding in overcoming the stationary inertia in the system. As the indexing movement ends, the energy storage cam follower 78 will resist motion of the energy storage cam 76, thus removing energy from the system and aiding in overcoming the rotational inertia in the system.

The ratios of the gears and the shapes of the cams of the elevator driving means and the energy storage means should be selected so that the elevators remain stationary while a substrate is pushed onto or off the elevators. These parameters depend primarily upon the distance between the stacks and the spacing of the carriers within a stack. The entire apparatus can be powered by a single electric motor or other power source (not shown) connected to an extension 82 of a conveyor shaft 38 as shown in FIG. 2.

According to the method of the invention a multiplicity of workpieces or substrates 16 are placed in two stacks 18 and 18a adjacent to coating or other process equipment 12 inside a sealable chamber 10. Preferably, the substrates are placed in carriers 20 which have wheels 22, and the carriers are supported in two vertical stacks on sections of track 24c on which the wheels roll. The chamber is sealed and evacuated as desired.

A substrate is conveyed from the top of the first stack to the top of the second by a multiplicity of pushers 26 suspended between two conveyor belts 34 and 34a guided by pulleys 36. Similarly, a substrate is conveyed from the bottom of the second stack to the bottom of the first. The substrates in the first stack are moved toward the top, preferably by a pair of opposed elevators 61 and 62 each comprising at least two opposed elevator belts 42 which support the sections of track 24c and which are guided by a number of pulleys 44. Similarly, the substrates in the second stack are moved toward the bottom, preferably by a pair of elevators 63 and 64.

The steps of conveying and moving the substrates may be repeated so that each substrate circulated between and through the stacks as many times as desired. The processing may occur at any point on a circuit, but preferably the substrates are processed as they are conveyed in one or both directions between the stacks. The conveyor may be slowed or stopped so that each substrate is exposed to the process equipment as desired. The processing on successive circuits may be the same or different. When the processing is complete, the substrates are removed from the chamber.

The structure described will allow the circulation of substrates shown in FIG. 1. However, many alternative embodiments are possible for the elevators and conveyor described. With respect to the elevators, see for example the substrate holders in U.S. Pat. No. 3,321,092 to Brichard. If desired, the workpieces in a vertical stack may be allowed to descend by their own weight. With respect to the conveyor, the tracks 24 described above may be replaced by rollers upon which the substrates or carriers may rest directly. The rollers may be powered to convey the substrates between stacks, and may find special advantage where especially large substrates or panels are to be coated which may not conveniently fit in a separate carrier. Finally, the stacks of substrates may comprise substrates placed on rows of tracks as shown herein, or in magazines or merely on top of one another. Therefore, the drawings and descriptions herein should be construed as being illustrative of a preferred embodiment and not to limit the scope of the invention and its equivalents as claimed.

I claim:

1. Apparatus for storing and transporting substrates inside an evacuable chamber containing vacuum coating equipment, comprising:
   (a) means for receiving and supporting a multiplicity of substrates in a first stack adjacent to the coating equipment;
   (b) means for receiving and supporting a multiplicity of substrates in a second stack adjacent to the coating equipment;
   (c) means for conveying a substrate from the top of the first stack to the top of the second stack;
   (d) means for moving the substrates in the second stack toward the bottom;
   (e) means for conveying substrates from the bottom of the second stack to the bottom of the first stack;
   (f) means for moving the substrates in the first stack toward the top; and
   (g) energy storage means for overcoming inertia in the first stack moving means and the second stack moving means, said storage means including a first shaft for driving the stack moving means, a second shaft for driving the first shaft, a detent cam fixed to the second shaft, a cam follower for alternately restraining and releasing the detent cam, and a torsion spring connected between the first shaft and the second shaft for storing energy as the first shaft rotates when the detent cam is restrained by the cam follower, and transmitting energy to rotate the second shaft when the detent cam is released.

2. Apparatus according to claim 1 further comprising:
   a multiplicity of carriers for receiving at least one substrate; and
   a multiplicity of rollers for supporting the opposite side edges of the carriers during conveyance between the first and second stacks.

3. Apparatus according to claim 2 further comprising:
   opposed sections of conveyor track, and wherein the first and second stacks are vertical stacks, and the rollers are wheels attached to opposite sides of the carriers for rolling on the sections of conveyor track.

4. Apparatus according to claim 3 wherein the means for moving substrates in each stack comprises two elevators each of which includes at least two opposed elevator belts, opposed sections of elevator track supported by the elevator belts, and a number of elevator pulleys for guiding each elevator belt so that movement of the elevator belts around the elevator pulleys will raise or lower the sections of elevator track; and the substrate conveying means comprises two opposed conveyor belts, a number of pulleys for guiding each conveyor belt, and a multiplicity of pushers suspended between the conveyor belts and engagable with the carriers.

5. Apparatus according to claim 4 further comprising means for driving the elevators in timed relation to the substrate conveying means.

* * * * *